Jan. 21, 1969 F. M. WANLASS 3,423,606

DIODE WITH SHARP REVERSE-BIAS BREAKDOWN CHARACTERISTIC

Filed July 21, 1966

INVENTOR
FRANK M. WANLASS
BY James and Franklin
ATTORNEY

United States Patent Office 3,423,606
Patented Jan. 21, 1969

3,423,606

DIODE WITH SHARP REVERSE-BIAS BREAKDOWN CHARACTERISTIC

Frank M. Wanlass, Huntington, N.Y., assignor to General Instrument Corporation, Newark, N.J., a corporation of Delaware Filed July 21, 1966, Ser. No. 566,802
U.S. Cl. 307—302 4 Claims
Int. Cl. H03k 3/26

ABSTRACT OF THE DISCLOSURE

In a semiconductor diode of the MOS-type comprising a substrate primarily of a first conductivity type and having a portion of a second conductivity type, the junction between the two conductivity types extending to a surface of the substrate and that surface being covered by a metal oxide dielectric layer, a sharp reverse-bias breakdown characteristic is imparted by providing a conductive layer on the top of the oxide insulating layer which extends along and to either side of the junction line, and which is biased in a manner comparable to that of the substrate proper.

Figure 1:
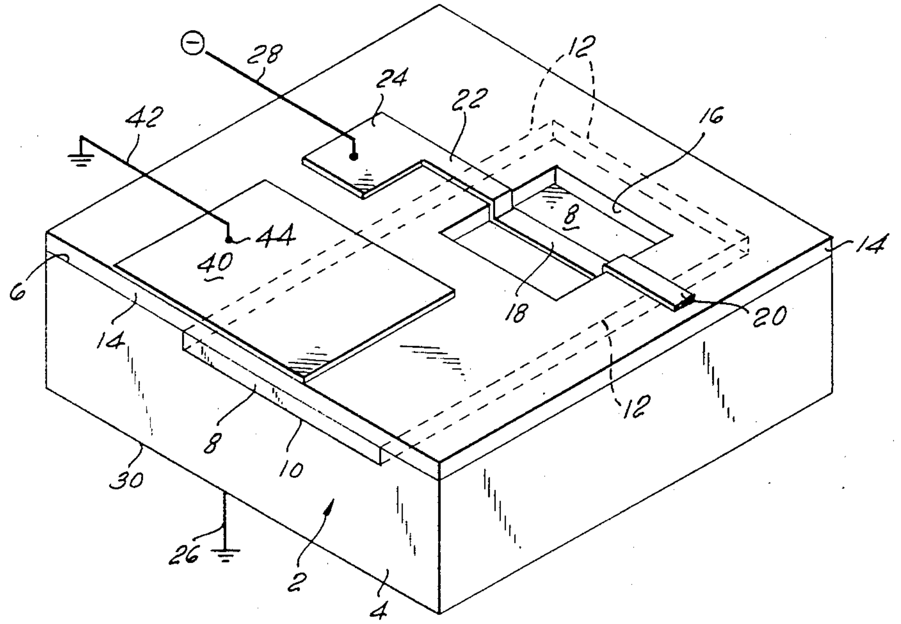

The present invention relates to a semiconductor diode construction having a sharp reverse-bias breakdown characteristic.

The special utility of those diodes which, when reverse-biased, pass substantially no current until the bias reaches a predetermined value, and then pass whatever amount of current is required to maintain the voltage across the diode constant, is widely appreciated. So-called Zener diodes have this characteristic, and they are widely used for many purposes; for example, they serve as voltage references, and they also function as protection devices, connected between a voltage source and additional circuitry and effective to ensure that no more than a predetermined voltage is applied to that additional circuitry. This latter use of Zener diodes is quite important where the succeeding circuitry is liable to be damaged if subjected to an over-voltage condition.

Not all diodes have the characteristic of a sharp transition between a condition where no current is passed and a condition where large values of current are passed. The condition under reverse bias where large values of current are passed is called the "breakdown" condition, and the sudden or abrupt transition between a rectifying condition and a breakdown condition is called a sharp breakdown characteristic. With ordinary diodes the breakdown characteristic is not sharp; up to a given value of reverse bias substantially no current is passed, but as that valve of reverse bias is exceeded, the current passed in the reverse direction tends to increase relatively slowly with increases in voltage within an appreciable range. Hence the maximum voltage which can be produced across such ordinary diodes in reverse bias condition will be considerably higher than the reverse bias voltage when effective rectification ceases and passage of appreciable amounts of reverse current commences.

The construction of diodes which have the desired sharp reverse bias breakdown characteristic has been such, insofar as known technology is concerned, that they cannot well be incorporated into integrated circuits, and particularly integrated circuits of the metal oxide semiconductor type, known as MOS circuits. Such circuits comprise a semiconductor substrate, usually of silicon and primarily of a given conductivity type, in which areas of the opposite conductivity type are formed in any appropriate manner, usually by means of diffusion. P-N junctions are formed in the substrate between adjacent portions of different conductivity types and these junctions exhibit rectifying characteristics. Thus a pair of substrate portions of opposite conductivity type, with the junction therebetween, can constitute a diode having rectification characteristics. MOS-type devices further include an insulating layer, usually of a metal oxide such as silicon dioxide, as the name MOS implies, which covers the surface of the substrate where the portions of different conductivity types are exposed, and through which openings are formed so that appropriate ohmic electrical connections may be made to desired portions of that surface. In the case of a MOS-type diode, electrical connection is generally made to one exposed substrate portion through an opening in the oxide layer, and electrical connection to the semiconductor portion of opposite conductivity type is generally made at another surface of the substrate. In integrated circuitry the electrical connections between the thus-formed diode and other portions of the integrated circuit are made by means of conductive strips which extend over the insulating layer and hence out of conductive connection with those portions of the substrate therebelow.

Rectifying diodes made in accordance with this technique have in the past exhibited a very gradual breakdown characteristic and hence, although they have been used as voltage protection devices, their effectiveness in that regard has left much to be desired, particularly insofar as protection against low values of over-voltage value are concerned. For example, in production units reliable over-voltage protection has been attainable only for voltage values of 80–100 volts.

It is the prime object of the present invention to devise a novel diode construction which, when reverse biased, has an exceedingly sharp breakdown characteristic, which construction is exceptionally well adapted to be incorporated into MOS devices and other types of integrated circuitry.

I have found that the reverse biased breakdown characteristic of conventional MOS-type diodes, and other diodes similarly formed, which diodes normally have an excessively gradual breakdown characteristic, can be made exceptionally sharp if a conductive layer is placed atop the insulating layer over an area registering with the line at the surface of the substrate covered by the insulating layer which is defined by the rectifying junction, and if this conductive layer is biased so as to be at the potential of the substrate or between the substrate potential and that of the portion of other conductivity type forming with the substrate the rectifying junction. The extent to which the reverse-bias breakdown characteristic of the diode is sharpened will depend to some extent upon the portion of the junction line which is thus covered by the conductive layer, the greater the length of the line which is covered the sharper the resulting breakdown characteristic. However, this relationship continues only up to a non-critical point; once the conductive layer has registered with a significant length of the junction line, a highly satisfactory sharpness is produced in the breakdown characteristic, and further extension of the conductive layer along the junction line has no apparent material effect.

The advantages attendant upon the instant invention are quite dramatic. A MOS diode the reverse current carrying characteristic of which extends over a range of applied reverse bias voltage from 30 volts to approximately 80–100 volts, and which therefore provides protection for subsequent circuitry only against a maximum voltage of 80–100 volts, is, merely by adding thereto the appropriate biased conductive layer which is characteristic of the present invention, converted to a device having a very sharp reverse-bias breakdown voltage characteristic occurring at 30 volts, thus providing for reliable protection to subsequent circuitry against voltages in excess of 30 volts.

The precise reason why these results are obtained is not clear, and consequently this invention should be considered as a purely empirical one. However, one theory which may be advanced and which appears to have merit, and which is therefore here tentatively set forth, is as follows: An electrostatic field exists between the two semiconductor portions of opposite conductivity type to which the reverse bias is applied. This electrostatic field extends from one substate portion to the other around the edge of the junction therebetween. Since that edge is exposed at the surface of the substrate covered by the insulating layer, the equipotential lines of this electrostatic field tend to pass through that insulating layer. The concentration of these lines will vary as the voltages applied to the semiconductor portions in question vary, and the concentration of these lines in any given area will play a part in the establishment of a breakdown condition. Likewise, an electrostatic field emanates from the conductive layer when it is appropriately biased, and since that conductive layer is positioned directly above, and preferably closley spaced with respect to, the junction line, the electrostatic field emanating from the conductive layer also enters the insulating layer and acts upon the electrostatic field emanating from the substrate. The result of this action is that the equipotential lines of the electrostatic field emanating from the substrate are forced down toward the substrate, their concentration is increased, and hence the breakdown characteristic of the diode is made sharp. As I have indicated above, this explanation is advanced purely as a theory which appears to have merit in explaining an empirically observed result, and is not necessarily the last theoretical word on the subject, nor even certainly an accurate theoretical explanation.

Figure 2:
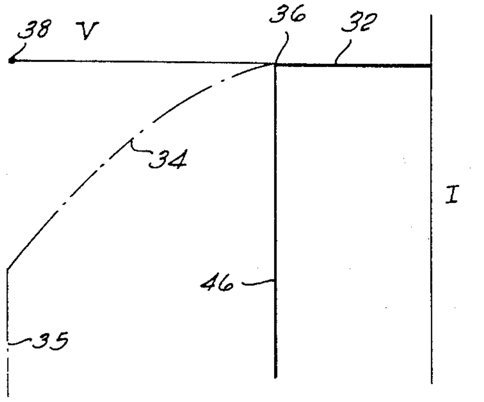

To the accomplishment of the above, and to such other objects as may hereinafter appear, the present invention relates to the construction of a semicondctor diode having a sharp reverse-bias breakdown characteristic, as defined in the appended claims and as described in this specification, taken together with the accompanying drawings, in which:

FIG. 1 is an idealized schematic representation of the construction and arrangement of an exemplary diode of the present invention specifically of a MOS-type adapted to be embodied in an integrated circuit, the parts being shown on a greatly enlarged scale and not necessarily in proper relative proportions; and FIG. 2 is a graphical representation of the reverse bias characteristics of diodes of the general type shown in FIG. 1.

Since the diode construction of the present invention is exceptionally adaptable for use in MOS-type integrated circuitry (although it is not exclusively limited thereto), it will, for exemplary purposes, be here described in that connection. Thus FIG. 1 represents that discrete portion of an integrated circuit of the MOS-type in which the diode of the present invention is incorporated. The diode portion of the integrated circuit comprises a substrate generally designated 2 of appropriate semiconductor material such as silicon, one portion 4 of which is of a predetermined conductivity type, for example, N-type. The substrate 2 has an upper surface 6, and extending into the substrate 2 from the upper surface 6 is a substrate portion 8 which is of a conductivity type opposite to that of the substrate portion 4, for example, P-type. A junction, indicated by the line 10 in FIG. 1, is defined between the semiconductor portions 4 and 8 of opposite conductivity types. The edges of that junction 10 extend to the substrate surface 6, there being indicated on FIG. 1 by the lines 12. The junction 10 exhibits rectifying characteristics, and consequently the substrate portions 4 and 8, with the junction 10 therebetween, define a rectifying diode.

A layer 14 of insulating material is provided atop the substrate surface 6. This layer may be formed, for example, of a metal oxide, conveniently silicon dioxide when the substrate 2 is formed of silicon. An opening or window 16 is formed in the insulating layer 14 over part of the P-type substrate portion 8, an ohmic connection to the P-type substrate portion 8 is made through the opening 16 in any appropriate fashion, as by means of a conductive strip 18 which appropriately engages the exposed upper surface of the substrate portion 8, which has an extension 20 leading to and making electrical connection with succeeding circuit elements, and which has an extension 22 leading to a pad 24 to which an external lead 28 is adapted to be bonded in any appropriate fashion. The extensions 20 and 22 and the pad 24 are all located on top of the insulating layer 14 and hence are prevented from making electrical connection with the N-type substrate portion 4. The diode as thus far described is a conventional MOS-type diode. In a typical circuit application the N-type substrate portion 4 is adapted to be connected to a reference potential such as ground, as indicated by the line 26, while the pad 24, and hence the P-type semiconductor portion 8, is adapted to be connected to a source of negative potential by the lead 28 bonded to the pad 24. As indicated, the electrical connection to the N-type substrate portion 4 is generally, but not necessarily, made at the surface 30 of the substrate 2 opposite the surface 6 thereof.

The reverse-bias characteristic of the prior art diode as thus far described is indicated in FIG. 2 by the graph portions 32, 34 and 35, the portions 34 and 35 being shown in broken lines. As the negative potential applied to the pad 24 increases, that is to say, as the reverse-bias exerted across the junction 10 increases, up to a certain value, substantially no reverse current passes through the diode. This is represented by the graph portion 32 in FIG. 2. As the reverse-bias increases beyond the point 36 on the graph of FIG. 2, appreciable amounts of reverse current begin to flow, the amount of such reverse current flow varying with the reverse bias as indicated by the graph portion 34. Eventually, when the reverse bias increases to a value indicated by the point 38 on FIG. 2, a full breakdown will occur, as indicated by the graph portion 35. In a typical embodiment the voltage value corresponding to point 36 may be 30–40 volts and the voltage value corresponding to point 38 may be 80–100 volts.

In accordance with the present invention a conductive layer 40 is applied on top of the insulating layer 14 so as to extend along and over a substantial portion of the junction line 12 at the substrate surface 6, and so as to extend to either side of that line, part of the layer 40 thus overlying the N-type substrate portion 4 and part of that conductive layer overlying the P-type substrate portion 8. Electrical connection is made to the conductive layer 40 in any appropriate manner, as by the lead 42 bonded thereto at 44, and a biasing voltage is applied to the lead 42, and hence to the conductive layer 40, which is reverse-biased relative to the potential applied to the lead 28. That is to say, in the embodiment here specifically illustrated, the lead 42 is maintained in a potential which is less negative than lead 28. Preferably it, like the lead 26, is grounded. In general, it may be stated that the potential applied to the conductive layer 40 should be different from that applied to the minor substrate portion 8, and should differ from the potential applied to the substrate portion 8 in the same sense as the potential applied to the main substrate portion 4 differs therefrom. The extent to which the potential applied to the conductive layer 40 differs from that applied to the minor substrate portion 8 appears to have an effect on the sharpness of the breakdown characteristic produced, with increased sharpness in that breakdown characteristic accompanying increased difference between the potential applied to the conductive layer 40 as compared to that applied to the substrate portion 8, best results occurring when, as is here disclosed, the potential applied to the conductive layer 40 is the same as that applied to the main substrate portion 4.

By applying the conductive layer 40 and providing appropriate bias thereto as described, the breakdown characteristic of the diode is converted from one represented by the graph portions 32, 34, 35 to one represented by the graph portions 32 and 46. Once the reverse bias reaches a value represented by the point 36 on the graph of FIG. 2, any further increase in reverse bias voltage will cause an appropriate high value of reverse current to pass through the diode, so that the voltage thereacross does not exceed that represented by the point 36, which may, in a typical instance, correspond to a value of 30–40 volts.

The extent to which the conductive layer 40 extends along the junction line 12 exposed at the substrate surface 6 is not critical. When the length of the conductive layer 40 along the line 12 is quite small compared with the length of the line 12, the improvement in the sharpness of the breakdown characteristic will be correspondingly small, and as the length of the line 12 which is covered by the conductive layer 40 increases the improvement in the sharpness in the breakdown characteristic will correspondingly increase. There comes a point, however, when further increase in the length of the line 12 covered by the conductive layer 40 does not result in any appreciable improvement in the sharpness of the breakdown characteristic. The precise point where this occurs varies from device to device, and is probably best determined in any given instance on an empirical basis. It has been found that in certain devices this point is reached when the conductive layer 40 extends along the line 12 for a distance of .001 inch, but this value is purely exemplary.

It is only necessary that the conductive layer 40 register with the line 22 and extend a finite distance to either side thereof. The length of that finite distance appears to have little or no effect on the results produced. The conductive layer 40 is here shown as extending for appreciable distances to either side of the line 22, but this is only for clarity of illustration. Excellent results have been obtained with conductive layers 40 having a width only of .0002 inch. Processing limitations—the need to allow for misalignment between masks and substrate—are the controlling consideration here, rather than electrical limitations.

It has been found desirable that the conductive layer 40 be located relatively close to the substrate surface 6, that is to say, the thickness of the insulating layer 14 beneath the conductive layer 40 should be comparatively thin. A thickness of approximately 1000 Angstroms for the conductive layer 40 has been found to give satisfactory results in a MOS-type device, but once again this must be considered merely as exemplary.

Not only is the device of the present invention particularly well adapted to be incorporated into integrated circuitry, as has already been pointed out, but its value as a protective device in integrated circuitry is particularly significant, since the circuit elements of MOS-type integrated circuitry are generally characterized by a high input resistance and low input capacitance, thus making them very susceptible to damage by voltages such as might be produced by static charges or line voltage transients.

The graphical representation of FIG. 2 is to be regarded as qualitative rather than precisely quantitative. The designation of the substrate portions 4 and 8 as N-type and P-type respectively, the appropriate biasing voltages, the use of silicon for the substrate 2 and silicon dioxide for the insulating layer 14, and the specific geometrical relationships disclosed, are all exemplary. Within these and other areas, many variations may be made in the details of that which is here specifically disclosed, all within the spirit of the invention as defined in the following claims.

I claim:

1. In a diode device comprising a substrate of semiconductor material having a first portion of given conductivity type and a second portion of the opposite conductivity type, a rectifying junction being defined between said portions of opposite conductivity types, both of said portions extending to a given surface of said substrate, said junction between said portions extending to said surface along a line, a thin metal oxide insulating layer on said surface and covering and extending to opposite sides of said junction line so as to overlie at least parts of both of said substrate portions, said layer having a thickness on the order of 1000 A., first and second ohmic connections to said portions of given and opposite conductivity types respectively, and means for biasing said first and second ohmic connections in reverse polarity relative to said rectifying junction; the improvement to product in said diode a sharp reverse-bias breakdown characteristic which comprises a conductive layer atop said insulating layer, insulated from said substrate and extending across said junction line, said conductive layer being electrically separated from said second ohmic connection, and means for biasing said conductive layer relative to said second ohmic connection in the same direction as is the bias applied to said first ohmic connection.

2. The diode device of claim 1, in which said means for biasing said conductive layer is effective to maintain said conductive layer at substantially the same biasing potential as said first ohmic connection.

3. The device of claim 1, in which said conductive layer extends along said junction line for a significant distance at least on the order of .001 inch.

4. The device of claim 3, in which the thickness of said insulating layer between said conductive layer and said substrate adjacent said junction line is on the order of 1000 Angstroms.

References Cited

UNITED STATES PATENTS

| | | | |
|---|---|---|---|
| 3,045,129 | 7/1962 | Atalla et al. | 317—235 |
| 3,204,160 | 8/1965 | Sah | 317—235 |
| 3,302,076 | 1/1967 | Kang et al. | 317—235 |
| 3,339,086 | 8/1967 | Shockley | 317—235 |

FOREIGN PATENTS

| | | |
|---|---|---|
| 1,361,215 | 4/1964 | France. |
| 6,413,894 | 8/1965 | Netherlands. |

OTHER REFERENCES

Extract from Texas Instruments booklet, New Product Review for Wescon, 1964, p. 11.

Electrode Control of $SiO_2$—Passivated Planar Junctions, by P. P. Castrucci and J. S. Logan, IBM Journal, September 1964, pp. 394–399.

JOHN W. HUCKERT, *Primary Examiner.*

R. F. POLISSACK, *Assistant Examiner.*

U.S. Cl. X.R.

317—234, 235